(12) United States Patent
Yoshizawa (10) Patent No.: US 6,490,994 B1
(45) Date of Patent: Dec. 10, 2002

(54) PLASMA PROCESSING APPARATUS (75) Inventor: Takashi Yoshizawa, Soraku-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 44 days.

(21) Appl. No.: 09/598,574

(22) Filed: Jun. 21, 2000

(30) Foreign Application Priority Data

Jun. 22, 1999 (JP) .......................................... 11-174909

(51) Int. Cl.⁷ ............................................. C23C 16/52
(52) U.S. Cl. ............................ 118/723 ER; 118/723 R; 118/723 E
(58) Field of Search .................................. 118/715, 718, 118/723 ER, 723 R, 726; 204/192.12, 298.11, 298.33; 216/38, 68; 427/575

(56) References Cited

U.S. PATENT DOCUMENTS 6,029,602 A * 2/2000 Bhatnagar ............ 118/723 ME

FOREIGN PATENT DOCUMENTS

| JP | 07029879 A | 1/1995 |
| JP | 08167591 A | 6/1996 |
| JP | 8-279498 | 10/1996 |

OTHER PUBLICATIONS

P.J. Matsuo et al, "Role of N2 addition on CF4/O2 remote plasma chemical dry etching of polycrystalline silicon.", J.Vac.Sci.Technol. A 15(4), Jul./Aug. 1997, pp. 1801–1813.*

Office Action of Korean Patent Office and translation.

* cited by examiner

Primary Examiner—Gregory Mills
Assistant Examiner—Rudy Zervigon
(74) Attorney, Agent, or Firm—Dike, Bronstein, Roberts & Cushman; David G. Conlin (57) ABSTRACT

A plasma processing apparatus that allows processing of high quality under a wider processing condition is provided by optimizing the distance between a plasma region and a substrate even in the case where the processing condition such as process pressure or high frequency output differs. A plasma chamber is divided into a lower plasma chamber and an upper plasma chamber. A process chamber and the lower plasma chamber are connected flexibly by a lower chamber bellows. The lower plasma chamber and the upper plasma chamber are connected flexibly by an upper chamber bellows. Since the radioactive species volume is increased when the process pressure is low, the lower and upper plasma chambers are respectively raised. In contrast, since the radioactive species volume is reduced when the process pressure is high, the upper and lower plasma chambers are respectively lowered.

13 Claims, 7 Drawing Sheets

PLASMA PROCESSING APPARATUS

BACKGROUND OF THE INVENTION

1. Field of the Invention

The present invention relates to an apparatus for fabricating a semiconductor device such as an integrated circuit, a liquid crystal display, a solar cell or the like, particularly to a plasma processing apparatus.

2. Description of the Background Art

In recent years, a diode parallel plate plasma enhanced CVD system having electrodes arranged in parallel is employed in the method of forming a thin film on a substrate. Using the diode parallel plate plasma enhanced CVD system, gas is excited and disintegrated by the plasma potential due to the presence of the plasma 2–5 cm above the surface of the substrate. The disintegrated gas reacts with the surface of the substrate, whereby the surface of the substrate is damaged or contaminated.

Japanese Patent Laying-Open No. 8-279498 discloses a plasma processing apparatus having plasma located remote from the substrate as a method of solving the aforementioned problem. This plasma processing apparatus is shown in FIG. 6.

Figure 6:
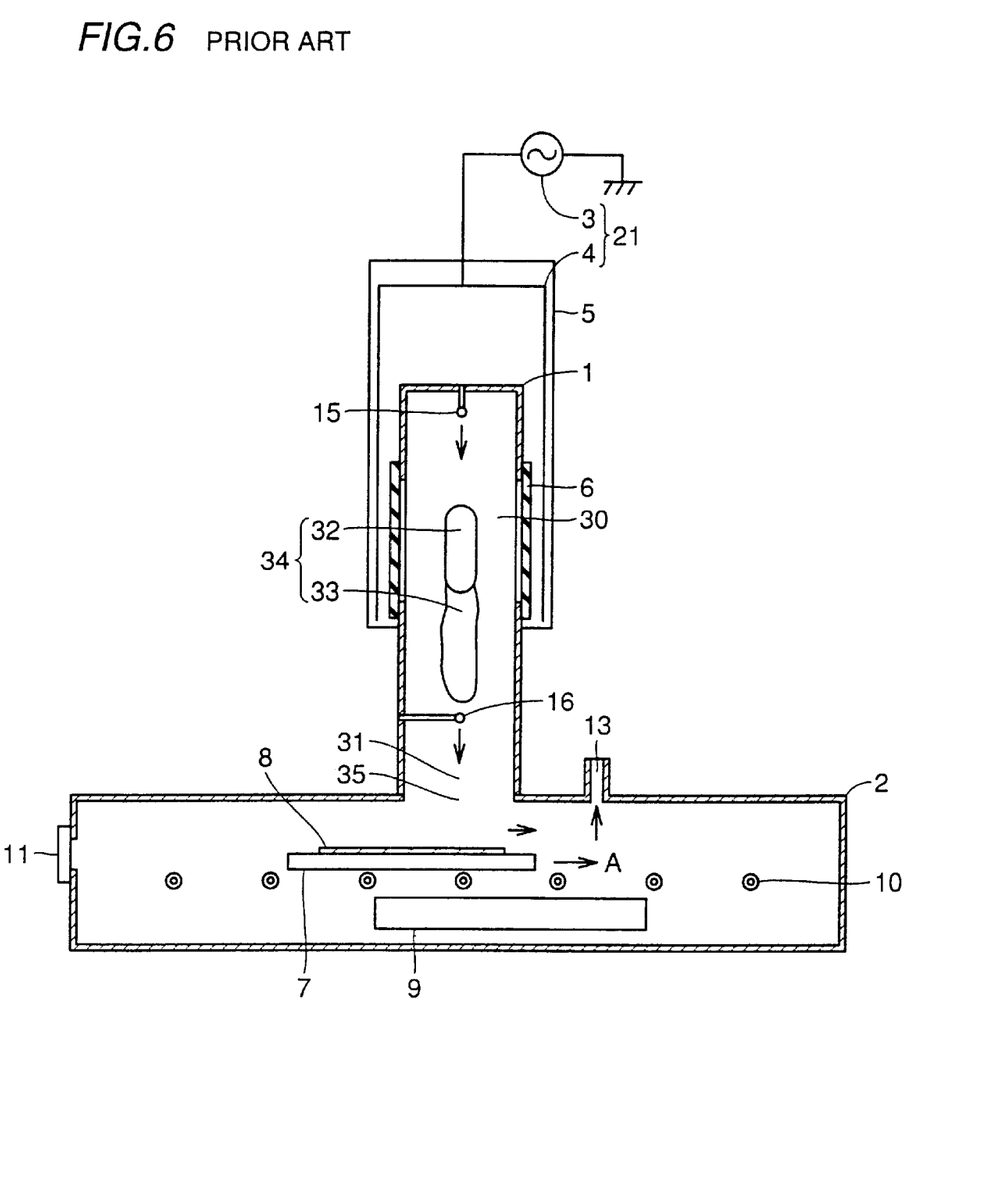
FIG. 6 is a sectional view of a conventional plasma processing apparatus.

Referring to FIG. 6, the plasma processing apparatus has a substrate 8 to be processed mounted on a substrate holder 7 to be shifted in the direction of arrow A below a plasma chamber 1 by a substrate transport unit 10. A substrate heater 9 is arranged under substrate transport unit 10.

An electric field generator 21 formed of a high frequency power supply 3 and a resonator 4 is arranged outside plasma chamber 1. The high frequency generated by high frequency power supply 3 is guided into plasma chamber 1 through a dielectric window 6 to produce an electric field by resonator 4.

An excitation gas introduction nozzle 15 is provided at the upper region in plasma chamber 1 to introduce excitation gas. A reaction gas introduction nozzle 16 is arranged at the lower region in plasma chamber 1 to introduce reaction gas. The excitation gas input through excitation gas introduction nozzle 15 is converted into plasma and mixed with the reaction gas input through reaction gas introduction nozzle 16. The mixture is discharged from a plasma chamber opening 35 so as to effect gas-phase reaction at the surface of substrate 8.

Plasma chamber 1 is functionally divided into a plasma region 30 and a drift region 31. Plasma region 30 includes a radioactive species volume 34 including plasma 32 in which activated species are generated and an afterglow 33 in which collapsing radioactive activated species move.

Drift region 31 is located between radioactive species volume 34 and plasma chamber opening 35 where non-radioactive activated species move. Drift region 31 serves to filter and remove activated species that are not selected to promote collision of extremely dynamic activated species, whereby damage onto the surface of substrate 8 is suppressed. Drift region 31 includes an excitation gas flow to reduce reaction gas flowing backwards towards plasma 32.

In FIG. 6, a process chamber 2 is provided below plasma chamber 1. A shield plate 5 is arranged outside plasma chamber 1. Substrate 8 is introduced into plasma chamber 2 through a gate valve 11 and output from process chamber 2. An evacuation outlet 13 is arranged at the upper wall of process chamber 2.

In the plasma processing apparatus of the above-described structure, the volume of radioactive species volume 34 including plasma 32 and afterglow 33 changes depending upon the processing condition such as the process pressure or high frequency output. The change in volume of radioactive species volume 34 corresponding to different process pressure is shown in FIGS. 7A–7C.

Figure 7A:
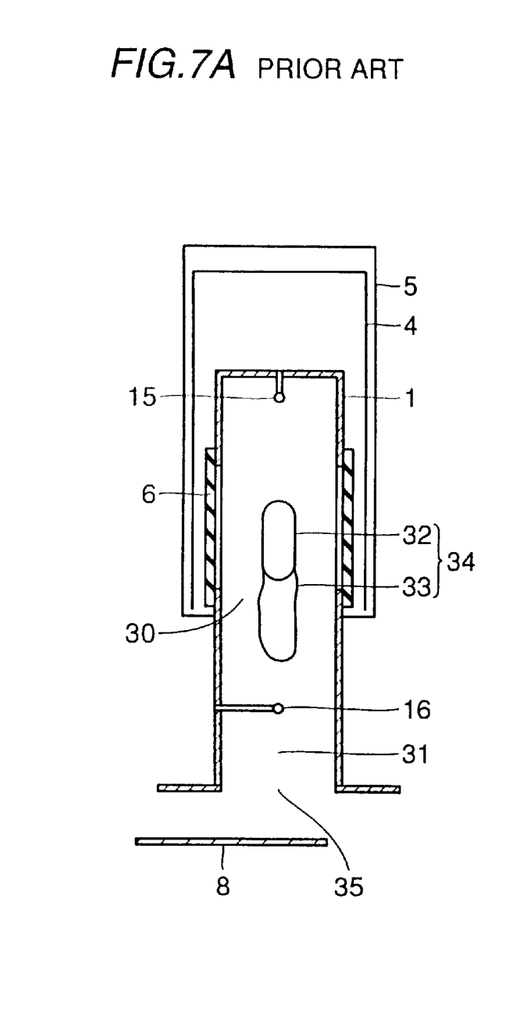
FIGS. 7A, 7B and 7C are diagrams to describe the status of radioactive species volume in a conventional plasma processing apparatus.
Figure 7B:
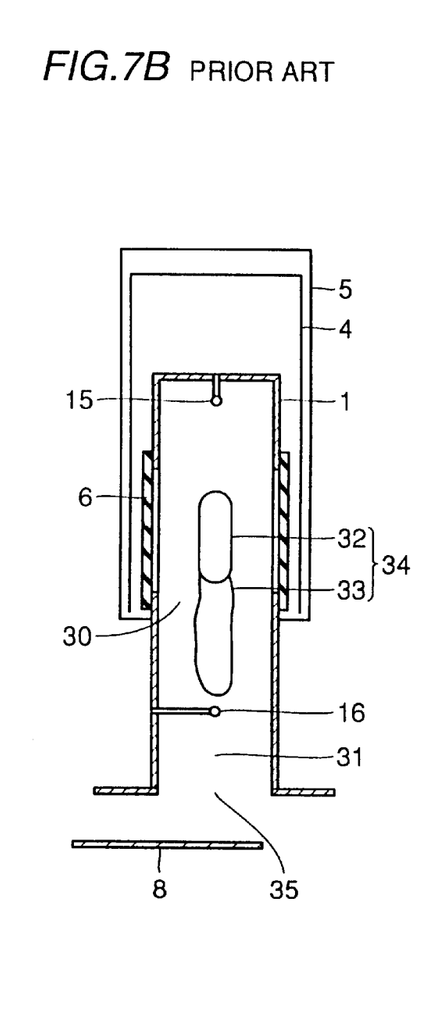
Figure 7C:
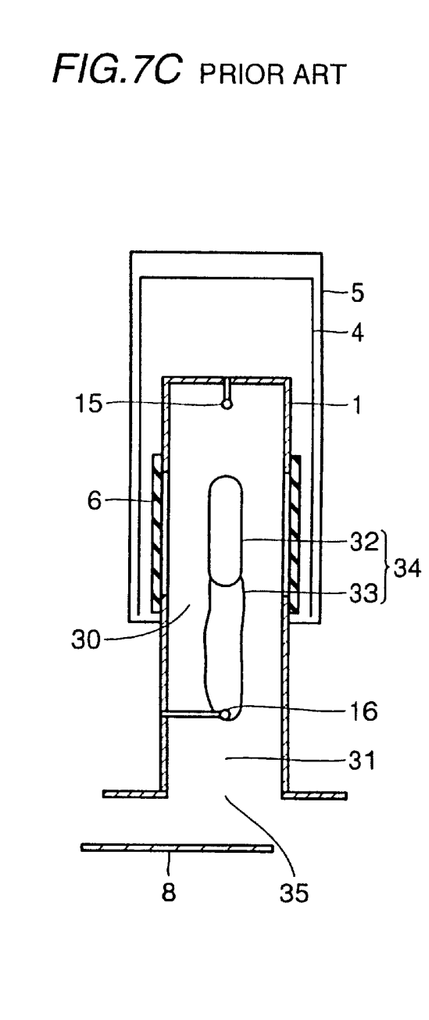

FIG. 7C corresponds to the case where the process pressure is lower than that of FIG. 7B. It is appreciated from FIG. 7C that radioactive species volume 34 is increased so that afterglow 33 reaches the neighborhood of reaction gas introduction nozzle 16 to induce the possibility of the reaction gas being converted into plasma when the process pressure is low. This means that the surface of substrate 8 may be damaged or contaminated despite the improved processing rate.

FIG. 7A corresponds to the case where the process pressure is higher than that of FIG. 7B. It is appreciated from FIG. 7A that radioactive species volume 34 becomes smaller when the process pressure is high. Occurrence of damage or contamination at the surface of substrate 8 is reduced whereas the processing rate is degraded.

The volume of radioactive species volume 34 changes corresponding to difference in the high frequency output, so that similar problems are encountered.

Thus, the volume of radioactive species volume 34 changes depending upon the processing condition, so that the degree of damage or contamination on the surface of substrate 8 and the processing rate differ. The system is subject to two competing considerations which represent the relationship of tradeoff.

SUMMARY OF THE INVENTION

In view of the foregoing, an object of the present invention is to provide a plasma processing apparatus that allows processing of high quality under a processing condition of a wider range by setting the distance between the plasma region and the substrate in optimum even when the processing condition such as the process pressure or high frequency output differs.

According to an aspect of the present invention, a plasma processing apparatus includes a plasma chamber having a plasma region to generate plasma, a process chamber arranged below the plasma chamber and having a region where a plasma process is applied on a substrate to be processed, and a distance variable mechanism rendering the distance between the plasma region and the substrate to be processed variable.

In the foregoing plasma processing apparatus, the distance variable mechanism preferably includes a jack mechanism fixed to the plasma chamber and the process chamber. In this case, it is further preferable for the distance variable mechanism to include a motor connected to the jack mechanism. The jack mechanism is preferably connected to the motor through a gear and a rod.

According to another aspect of the present invention, a plasma processing apparatus includes a plasma chamber having a plasma region to generate plasma, a process chamber arranged below the plasma chamber and having a region to apply a plasma process on a substrate to be processed, and a plasma chamber expansion/contraction mechanism to expand or contract the length of the plasma chamber.

In the above plasma processing apparatus, the plasma chamber expansion/contraction mechanism preferably includes a bellows to provide flexible connection between the plasma chamber and the process chamber.

In the above plasma processing apparatus, the plasma chamber preferably includes a first plasma chamber connected to the process chamber and a second plasma chamber connected to the first plasma chamber. The plasma chamber expansion/contraction mechanism preferably includes a bellows providing flexible connection between the first and second plasma chambers. In this case, the plasma chamber expansion/contraction mechanism preferably includes a bellows providing flexible connection between the first plasma chamber and the process chamber. In this case, it is preferable for the second plasma chamber to include a window to introduce a high frequency electric field therein.

It is preferable for the plasma processing apparatus to further include a partition member between the plasma chamber expansion/contraction mechanism and the plasma region.

According to a further aspect of the present invention, a plasma processing apparatus includes a plasma chamber having a plasma region to generate plasma, a process chamber arranged below the plasma chamber and having a region to apply a plasma process on a substrate to be processed, an excitation gas introduction nozzle to introduce into the plasma chamber excitation gas to generate plasma, a reaction gas introduction nozzle to introduce in the process chamber reaction gas to apply a plasma process on the substrate to be processed, and a nozzle distance variable mechanism rendering the distance between the excitation gas introduction nozzle and the reaction gas introduction nozzle variable.

In the above plasma processing apparatus, the plasma chamber preferably includes a first plasma chamber connected to the process chamber and a second plasma chamber connected to the first plasma chamber. The excitation gas introduction nozzle is provided at the second plasma chamber. The reaction gas introduction nozzle is provided at the first plasma chamber. The nozzle distance variable mechanism preferably includes a jack mechanism fixed to the first plasma chamber and the second plasma chamber. In this case, the nozzle distance variable mechanism preferably includes a motor connected to the jack mechanism. The jack mechanism is preferably connected to a motor through a gear and a rod.

In the above plasma processing apparatus, the nozzle distance variable mechanism preferably renders the distance between the plasma region and the substrate to be processed variable.

Since the distance between the plasma region and the surface of the substrate to be processed can be set variable by the plasma processing apparatus of the present invention, the distance between the plasma region and the surface of the substrate to be processed can be set in optimum according to the processing condition. Damage on the surface of the substrate to be processed can be prevented by optimizing the drift region. Therefore, a plasma process of high quality is allowed under a wide range of processing condition.

The distance between the plasma region and the surface of the substrate to be processed can be set in optimum according to the processing condition by expanding or contracting the plasma chamber. Damage onto the surface of the substrate to be processed can be prevented by optimizing the drift region. Therefore, a plasma process of high quality is allowed under a wide range of processing condition.

By rendering variable the distance between the excitation gas introduction nozzle and the reaction gas introduction nozzle, only the effective activated species can be coupled with the reaction gas without coverage of the reaction gas introduction nozzle with the radioactive species volume. A plasma process can be carried out always in stability.

By rendering variable the distance between the plasma region and the surface of the substrate to be processed and also the distance between the excitation gas introduction nozzle and the reaction gas introduction nozzle, the distance between the plasma region and the surface of the substrate to be processed can be optimized according to the processing condition. Damage onto the surface of the substrate to be processed can be prevented by optimizing the drift region. A plasma process of high quality is allowed under a wide range of processing condition. Only the effective activated species can be coupled with the reaction gas without coverage of the reaction gas introduction nozzle with the radioactive species volume. A plasma process can be carried out always in stability.

By providing a partition wall between the plasma expansion/contraction mechanism and the plasma region, damage and product adherence caused by the plasma towards the mechanism can be prevented. Also, the scatter of dust particles from the mechanism can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to FIGS. 1–5.

First Embodiment

Figure 1:
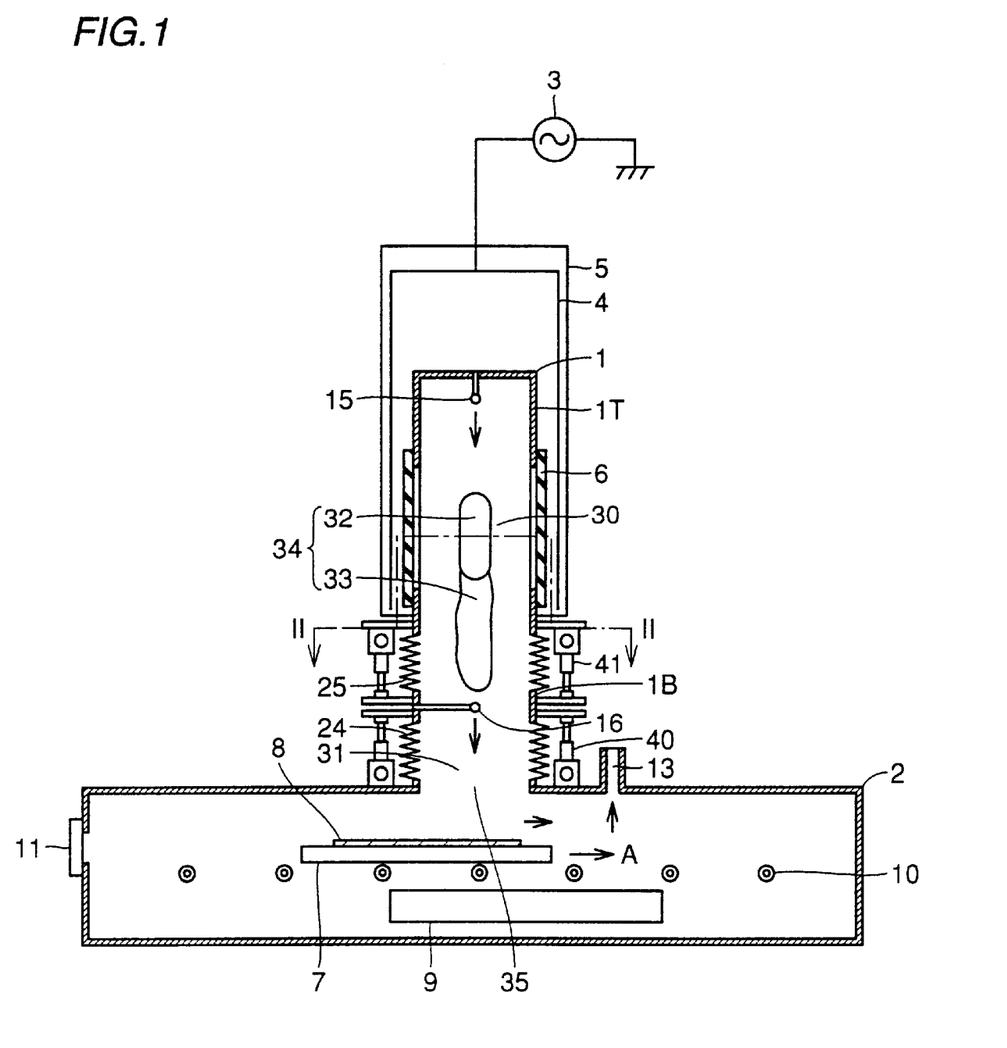
FIG. 1 is a sectional view of a plasma processing apparatus according to a first embodiment of the present invention.
Figure 2:
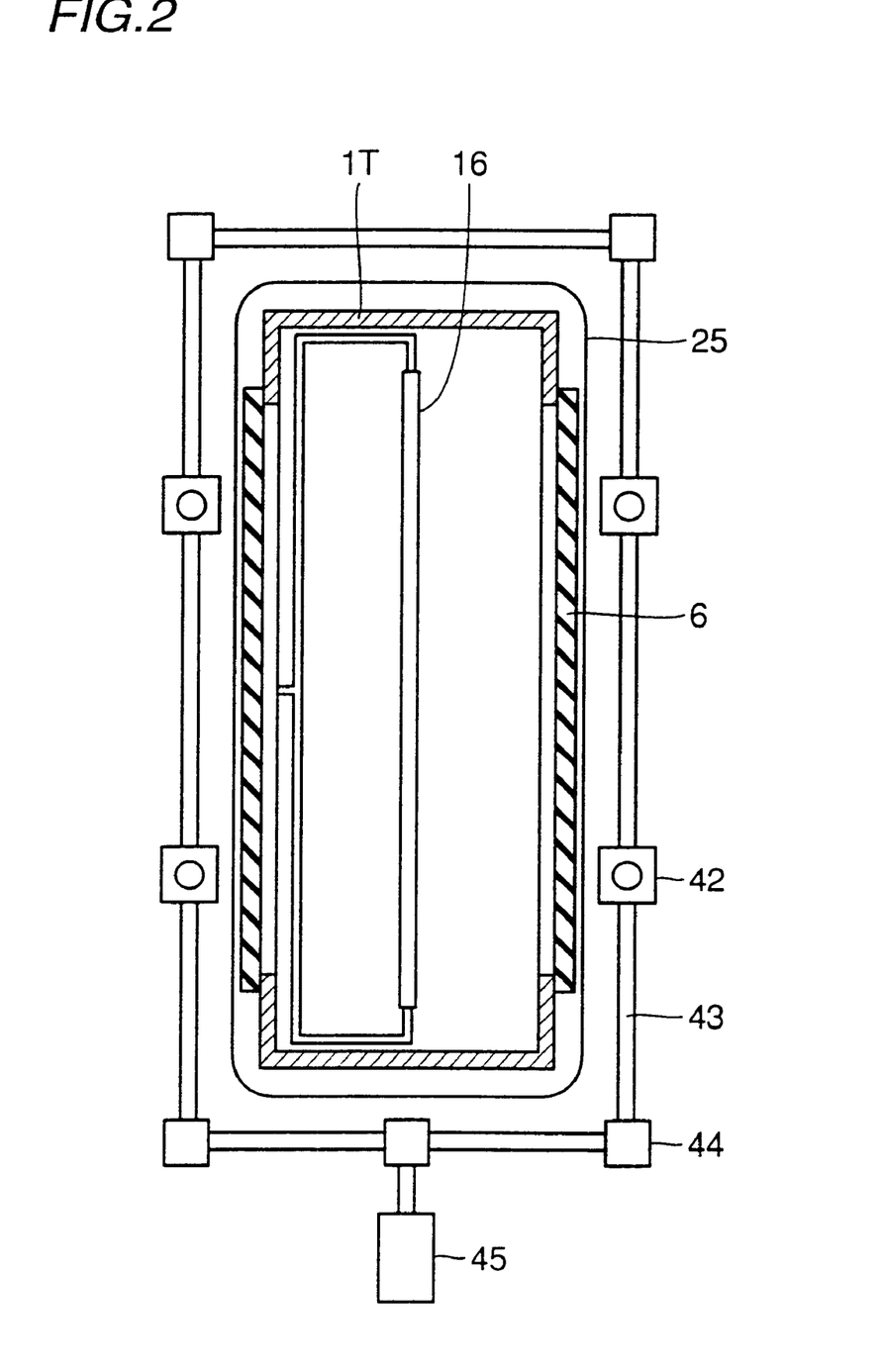
FIG. 2 is a sectional view of the plasma processing apparatus of FIG. 1 taken along line II—II.
Figure 3A:
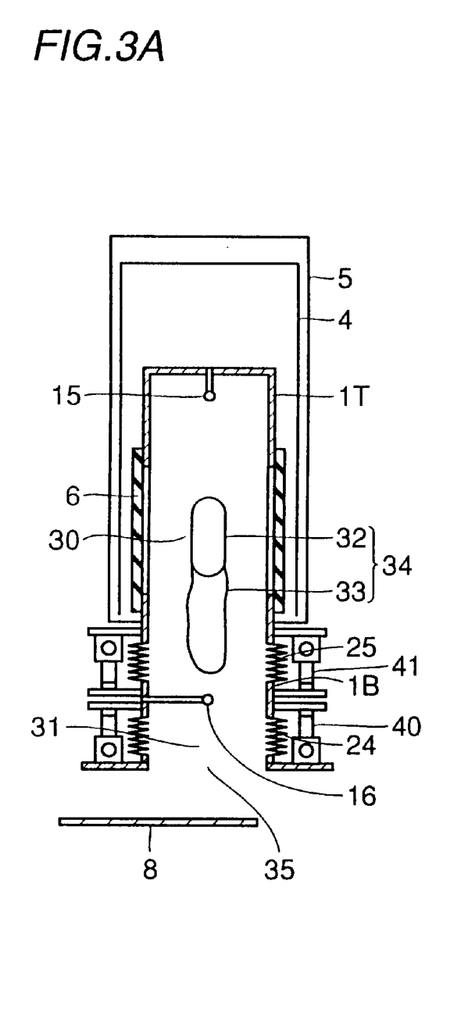
FIGS. 3A, 3B and 3C are diagrams to describe the status of radioactive species volume and the plasma chamber under different plasma pressure.
Figure 3B:
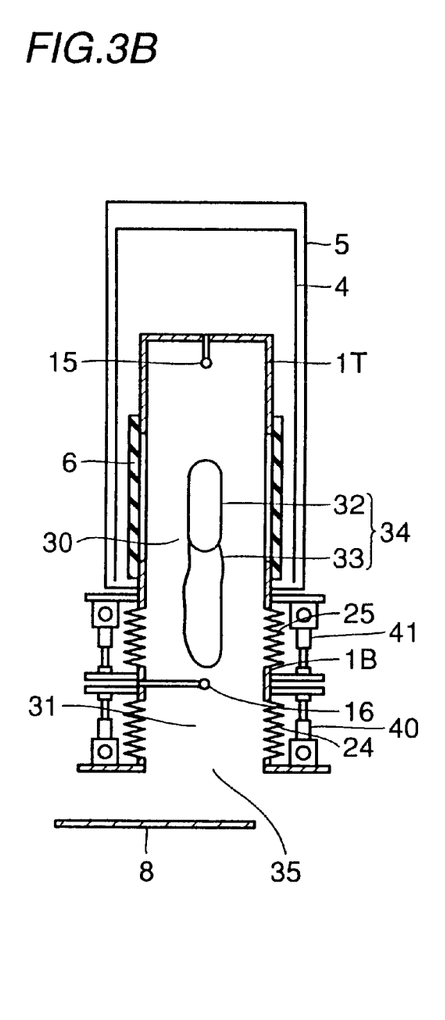
Figure 3C:
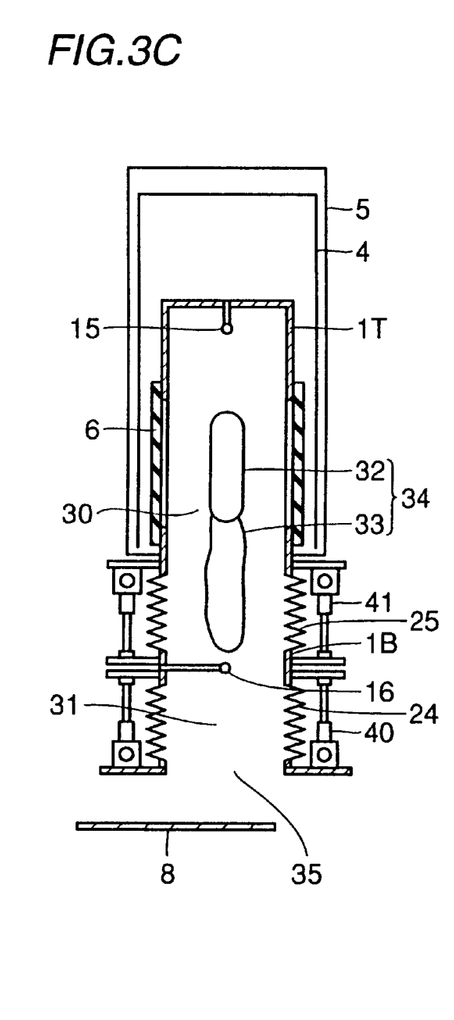

A first embodiment of the present invention will be described with reference to FIGS. 1–3C. FIG. 1 is a sectional view showing a plasma processing apparatus according to a first embodiment of the present invention. FIG. 2 shows a cross section taken along line II—II of FIG. 1, an upper dielectric window 6, and a lower reaction gas introduction nozzle 16. FIG. 3 is a diagram to describe the status of radioactive species volume and the plasma chamber corresponding to different process pressures.

Referring to FIGS. 1 and 2, the plasma processing apparatus of the first embodiment includes a plasma chamber 1 to generate plasma arranged above a process chamber 2. A thin long plasma chamber opening 35 is provided at the bottom of plasma chamber 1.

A high frequency power supply 3 to generate high frequency, a resonator 4 to generate an electric field, and a dielectric window 6 to introduce the electric field from resonator 4 inside are provided outside plasma chamber 1. Dielectric window 6 is located at both the left and right sides of plasma chamber 1. A shield plate 5 is arranged to prevent the electric field generated at resonator 4 from leaking outside.

An excitation gas introduction nozzle 15 having a plurality of holes arranged in a line to introduce excitation gas is provided in the proximity of the top plane in plasma chamber 1. A reaction gas introduction nozzle 16 having holes arranged in a line to introduce reaction gas is provided at the lower portion in plasma chamber 1.

Plasma chamber 1 can be arranged oblique with respect to the direction of travel A of substrate 8. Excitation gas introduction nozzle 15 and reaction gas introduction nozzle 16 can also be arranged other than at the center of plasma chamber 1.

Plasma chamber 1 is divided into a lower plasma chamber 1B and an upper plasma chamber 1T. Process chamber 2 is connected to lower plasma chamber 1B flexibly by a lower chamber bellows 24. Lower plasma chamber 1B is connected flexibly to upper plasma chamber 1T by an upper chamber bellows 25. Upper and lower chamber bellows 24 and 25 can be formed by welding a stainless steel plate of an ellipse, for example.

A lower jack 40 and an upper jack 41 are arranged outside plasma chamber 1 corresponding to lower chamber bellows 24 and upper chamber bellows 25, respectively. Lower jack 40 and upper jack 41 are fixed to process chamber 2 and lower plasma chamber 1B and to lower plasma chamber 1B and upper plasma chamber 1T, respectively.

For example, lower jack 40 is formed by connecting four jacks 42 and a motor 45 through a gear 44 and a rod 43, as shown in FIG. 2. Jacks 42 are raised/lowered by the rotation of motor 45. Upper jack 41 is formed likewise. Jacks 42 of upper jack 41 are also raised/lowered by the rotation of motor 45 to move upper plasma chamber 1T upwards or downwards. This elevation mechanism may take any other structure.

A small long evacuation outlet 13 is arranged at the top wall of process chamber 2 in proximity to and parallel with plasma chamber opening 35. In process chamber 2, a substrate holder 7 on which a substrate 8 is mounted is disposed on a substrate transport unit 10 to be conveyed in the direction of arrow A by operation of substrate transport unit 10. Also, a substrate heater 9 having a length from at least plasma chamber opening 35 to evacuation outlet 13 is disposed below substrate transport unit 10.

A gate valve 11 is disposed at the side wall of process chamber 2. Substrate 8 is introduced into process chamber 2 through gate valve 11 from an external chamber such as a load-lock chamber. Upon completion of the process on substrate 8, substrate 8 is conveyed out from process chamber 2 to an external chamber through gate valve 11.

Substrate holder 7 may have a substrate heat mechanism in which a resistor, for example, is incorporated. Also, substrate transport unit 10 can take any structure such as a roller, a rack-and-pinion, or the like.

The operation of a plasma process will be described here. The excitation gas introduced through excitation gas introduction nozzle 15 passes through dielectric window 6 to be excited by resonator 4, and mixed with reaction gas introduced through reaction gas introduction nozzle 16. The mixture is discharged to evacuation outlet 13 through plasma chamber opening 35.

Substrate 8 mounted on substrate holder 7 is conveyed in the direction of arrow A by substrate transport unit 10 while being heated to a predetermined temperature by substrate heater 9 to pass through the process zone where the mixture gas is introduced.

The mixture gas effects gas-phase reaction in the proximity of the surface of substrate 8 heated to the predetermined temperature. The surface of substrate 8 is sequentially processed. The gas-phase reaction causes deposition, etching or ashing with respect to the surface of substrate 8 according to the gas species used.

FIGS. 3A–3C show the volume of radioactive species volume 34 and status of plasma chamber 1 under different process pressures.

It is appreciated from FIGS. 3A–3C that the volume of radioactive species volume 34, i.e., the volume of plasma 32 and afterglow 33, changes according to the process pressure. Lower plasma chamber 1B and upper plasma chamber 1T are respectively raised or lowered accordingly.

FIG. 3C corresponds to the case where the process pressure is lower than that of FIG. 3B. It is appreciated from FIG. 3C that lower and upper plasma chambers 1B and 1T are respectively raised since radioactive species volume 34 is increased when the process pressure is low.

FIG. 3A corresponds to the case where the process pressure is higher than that of FIG. 3B. It is appreciated from FIG. 3A that lower and upper plasma chambers 1B and 1T are respectively lowered since radioactive species volume 34 is reduced when the process chamber is high.

By raising or lowering lower plasma chamber 1B and upper plasma chamber 1T, drift region 31 can be optimized. In other words, the distance between plasma region 30 and substrate 8 can be set in optimum. Only the effective activated species can be coupled with the reaction gas by the ascending and descending of upper plasma chamber 1T to optimize the distance between radioactive species volume 34 and reaction gas introduction nozzle 16.

Second Embodiment

Figure 4:
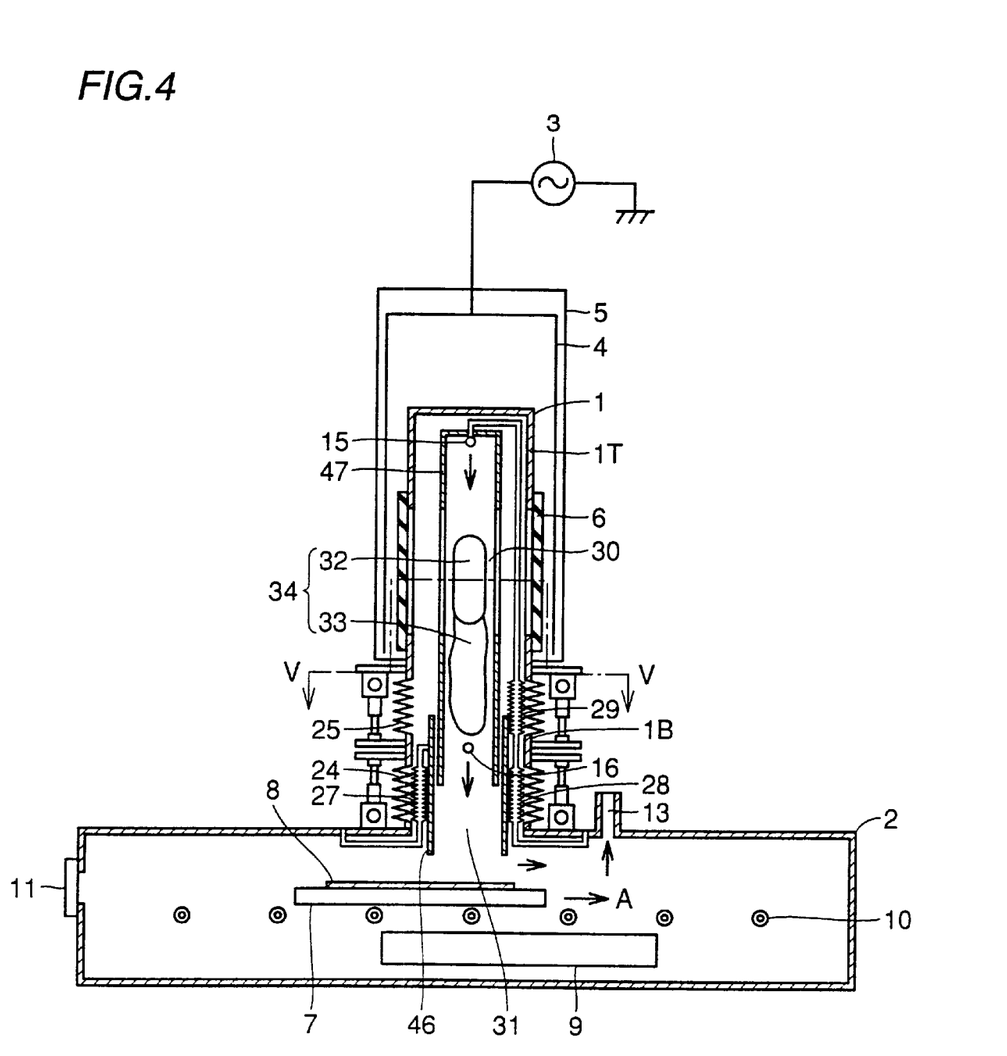
FIG. 4 is a sectional view of a plasma processing apparatus according to a second embodiment of the present invention.
Figure 5:
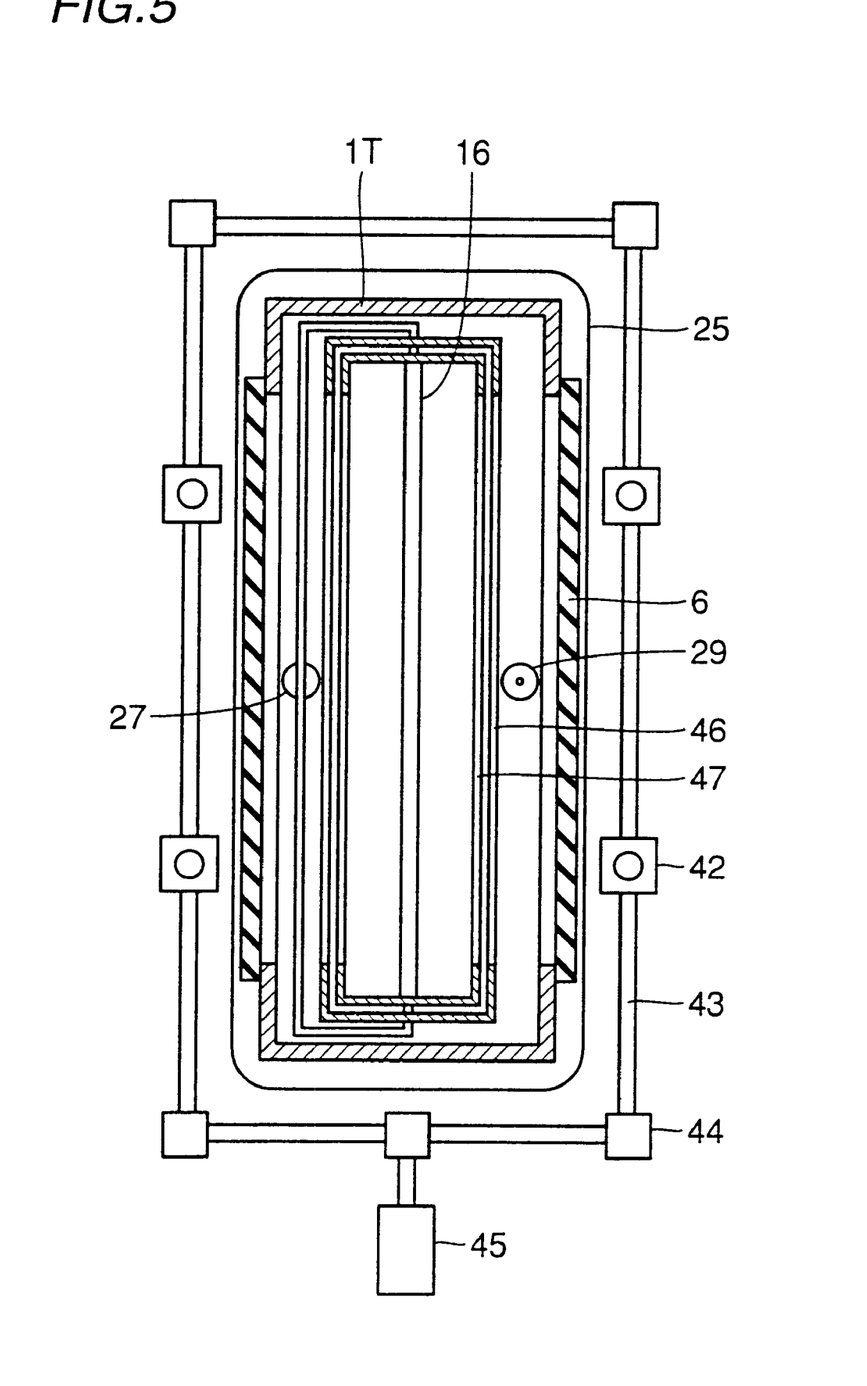
FIG. 5 is a sectional view of the plasma processing apparatus of FIG. 4 taken along line V—V.

A second embodiment of the present invention will be described with reference to FIGS. 4 and 5. FIG. 4 is a sectional view of a plasma processing apparatus according to the second embodiment. FIG. 5 is a sectional view taken along line V—V of FIG. 4, showing an upper dielectric window 6 and a lower reaction gas introduction nozzle 16. Description of components corresponding to those of the first embodiment will not be repeated.

As shown in FIG. 4, the plasma processing apparatus of the second embodiment has a pipe to introduce excitation gas and reaction gas connected from the top wall of process chamber 2, arranged along the side wall inside plasma chamber 1 to be connected to excitation gas introduction nozzle 15 and reaction gas introduction nozzle 16.

The pipe to introduce excitation gas is divided corresponding to process chamber 2, lower plasma chamber 1B and upper plasma chamber 1T, and respectively connected flexibly by a lower excitation gas bellows 28 and an upper excitation gas bellows 29. The pipe to introduce reaction gas is divided corresponding to process chamber 2 and lower plasma chamber 1B, and connected flexibly by a reaction gas bellows 27.

By this structure, excitation gas introduction nozzle 15 and reaction gas introduction nozzle 16 move corresponding to the ascending and descending of plasma chamber 1 to maintain a predetermined position.

Also, a lower partition 46 is disposed in lower plasma chamber 1B, fixed to process chamber 2. An upper partition 47 is arranged at the inner side of lower partition 46 in upper plasma chamber 1T, and fixed to upper plasma chamber 1T. A window to introduce an electric field is provided at upper partition 47 corresponding to dielectric window 6. Lower partition 46 and upper partition 47 are formed of a material such as stainless steel or ceramic.

By the shift of upper partition 47 corresponding to the ascending or descending of lower and upper plasma chambers 1B and 1T, the expansion/contraction mechanism, i.e. lower chamber bellows 24, upper chamber bellows 25, lower excitation gas bellows 28, upper excitation gas bellows 29 and reaction gas bellows 27, are always covered with upper partition 47 to prevent damage or adherence of a product caused by plasma 32 towards the chamber bellows or the gas bellows. Also, the scatter of dust particles generated when the chamber bellows and the gas bellows expand or contract can be prevented.

According to the plasma processing apparatus of the present invention, a plasma process of high quality under a wide range of processing condition is allowed by rendering the distance variable between the plasma region and the surface of the substrate to be processed.

Furthermore, a plasma process of high quality under a wide range of processing condition is allowed by the expansion/contraction of the plasma chamber.

By rendering variable the distance between the excitation gas introduction nozzle and the reaction gas introduction nozzle, a plasma process can be carried out always in stability.

By rendering variable the distance between the plasma region and the surface of the substrate to be processed and also the distance between the excitation gas introduction nozzle and the reaction gas introduction nozzle, a plasma process of high quality is allowed under a wide range of processing condition. The plasma process can be carried out always in stability.

By providing a partition between the plasma expansion/contraction mechanism and the plasma region, damage and product adherence caused by the plasma towards the mechanism can be prevented. Also, the scatter of dust particles from the mechanism can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma processing apparatus comprising:
   a plasma chamber having a plasma region to generate plasma,
   a process chamber dispose below said plasma chamber and having a region to apply a plasma process on a substrate to be processed, and
   a distance variable mechanism to set distance variable between said plasma region and said substrate to be processed,
   wherein said distance variable mechanism comprises a jack mechanism fixed to said plasma chamber and said process chamber.

2. The plasma processing apparatus according to claim 1, wherein said distance variable mechanism comprises a motor connected to said jack mechanism.

3. The plasma processing apparatus according to claim 2, wherein said jack mechanism is connected to said motor via a gear and a rod.

4. plasma processing apparatus comprising:
   a plasma chamber having a plasma region to generate plasma,
   a process chamber dispose below said plasma chamber and having a region to apply a plasma process on a substrate to be processed, and
   a plasma chamber expansion and contraction mechanism expanding and contracting the length of said plasma chamber,
   wherein said plasma chamber expansion and contraction mechanism comprises a bellows providing flexible connection between said plasma chamber and said process chamber.

5. A plasma processing apparatus comprising:
   a plasma chamber having a plasma region to generate plasma,
   a process chamber dispose below said plasma chamber and having a region to apply a plasma process on a substrate to be processed, and
   a plasma chamber expansion and contraction mechanism expanding and contracting the length of said plasma chamber,
   wherein said plasma chamber comprises a first plasma chamber connected to said process chamber, and a second plasma chamber connected to said first plasma chamber, and said plasma chamber expansion and contraction mechanism comprises a bellows providing flexible connection between said first plasma chamber and said second plasma chamber.

6. The plasma processing apparatus according to claim 5, wherein said plasma chamber expansion and contraction mechanism comprises a bellows providing flexible connection between said first plasma chamber and said process chamber.

7. The plasma processing apparatus according to claim 5, wherein said second plasma chamber includes a window to introduce a high frequency electric field inside.

8. A plasma processing apparatus comprising:
   a plasma chamber having a plasma region to generate plasma,
   a process chamber dispose below said plasma chamber and having a region to apply a plasma process on a substrate to be processed, and
   a plasma chamber expansion and contraction mechanism expanding and contracting the length of said plasma chamber,
   further comprising a partition member between said plasma chamber expansion and contraction mechanism and said plasma region.

9. A plasma processing apparatus comprising:
   a plasma chamber having a plasma region to generate plasma,
   a process chamber disposed below said plasma chamber and having a region to apply a plasma process on a substrate to be processed,
   an excitation gas introduction nozzle to introduce inside said plasma chamber excitation gas to generate plasma,
   a reaction gas introduction nozzle to introduce inside said process chamber reaction gas to apply a plasma process on a substrate to be processed, and
   a nozzle distance variable mechanism to set distance between said excitation gas introduction nozzle and said reaction gas introduction nozzle variable.

10. The plasma processing apparatus according to claim 9, wherein said plasma chamber includes a first plasma chamber connected to said process chamber, and a second plasma chamber connected to said first plasma chamber,
    said excitation gas introduction nozzle being provided at said second plasma chamber, and said reaction gas introduction nozzle being provided at said first plasma chamber,
    wherein said nozzle distance variable mechanism comprises a jack mechanism fixed to said first plasma chamber and said second plasma chamber.

11. The plasma processing apparatus according to claim 10, wherein said nozzle distance variable mechanism comprises a motor connected to said jack mechanism.

12. The plasma processing apparatus according to claim 11, where said nozzle jack mechanism is connected to said motor via a gear and a rod.

13. The plasma processing apparatus according to claim 9, wherein said nozzle distance variable mechanism includes setting distance variable between said plasma region and a substrate to be processed variable.

* * * * *